United States Patent
Albarede et al.

(10) Patent No.: US 10,903,050 B2
(45) Date of Patent: Jan. 26, 2021

(54) ENDPOINT SENSOR BASED CONTROL INCLUDING ADJUSTMENT OF AN EDGE RING PARAMETER FOR EACH SUBSTRATE PROCESSED TO MAINTAIN ETCH RATE UNIFORMITY

(71) Applicant: Lam Research Corporation, Fremont, CA (US)

(72) Inventors: Luc Albarede, Fremont, CA (US); Yassine Kabouzi, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 79 days.

(21) Appl. No.: 16/214,861

(22) Filed: Dec. 10, 2018

(65) Prior Publication Data

US 2020/0185194 A1 Jun. 11, 2020

(51) Int. Cl.
   *H01J 37/32* (2006.01)
   *H01L 21/66* (2006.01)
   *H01L 21/67* (2006.01)

(52) U.S. Cl.
   CPC .. *H01J 37/32183* (2013.01); *H01J 37/32541* (2013.01); *H01J 37/32642* (2013.01); *H01L 21/67069* (2013.01); *H01L 21/67253* (2013.01); *H01L 22/26* (2013.01); *H01J 2237/24495* (2013.01); *H01J 2237/3343* (2013.01)

(58) Field of Classification Search
   CPC ........... H01J 37/32183; H01J 37/32541; H01J 37/32642; H01J 2237/24495; H01J 2237/3343; H01L 21/67069; H01L 21/67253; H01L 22/26
   See application file for complete search history.

(56) References Cited

U.S. PATENT DOCUMENTS

| | | | |
|---|---|---|---|
| 5,213,658 A * | 5/1993 | Ishida | H01J 37/32623 118/723 R |
| 5,711,843 A * | 1/1998 | Jahns | B24B 37/013 156/345.24 |
| 5,800,619 A | 9/1998 | Holland et al. | |
| 5,841,651 A * | 11/1998 | Fu | G06K 9/00536 700/48 |
| 5,975,013 A | 11/1999 | Holland et al. | |
| 6,305,677 B1 | 10/2001 | Lenz | |
| 6,389,677 B1 | 5/2002 | Lenz | |
| 6,540,587 B1 * | 4/2003 | Gotkis | B24B 37/013 257/E21.528 |

(Continued)

*Primary Examiner* — Thomas C Lee
*Assistant Examiner* — Gary Collins

(57) ABSTRACT

A substrate processing system includes model generation and setpoint modules. The model generation module receives a first time trace based on an output of an endpoint sensor and obtains a target setpoint. A portion of the first time trace is indicative of an endpoint at which a feature has been created in a first substrate. The target setpoint is generated based on a metrology process and is used to compensate for erosion of a first edge ring. The model generation module generates a conversion model based on the portion and the target setpoint. The setpoint module: based on the output, receives a second time trace that is generated subsequent to generation of the first time trace; and based on the conversion model, converts the second time trace to a predicted erosion compensation setpoint, which is set while processing a second substrate using the first or a second edge ring.

24 Claims, 11 Drawing Sheets

(56) References Cited

U.S. PATENT DOCUMENTS

| | | |
|---|---|---|
| 9,368,340 B2 | 6/2016 | Kolics |
| 9,406,535 B2 | 8/2016 | Berry, III et al. |
| 9,481,942 B2 | 11/2016 | Zhou et al. |
| 9,677,190 B2 | 6/2017 | Kim et al. |
| 9,689,083 B2 | 6/2017 | Brogan et al. |
| 9,761,524 B2 | 9/2017 | Kolics |
| 9,779,955 B2 | 10/2017 | Lill et al. |
| 9,852,889 B1 | 12/2017 | Kellogg et al. |
| 9,892,956 B1 | 2/2018 | Konkola et al. |
| 9,916,993 B2 | 3/2018 | Berry, III et al. |
| 9,945,044 B2 | 4/2018 | Dinneen et al. |
| 9,960,068 B1 | 5/2018 | Konkola et al. |
| 10,020,220 B2 | 7/2018 | Konkola et al. |
| 10,510,516 B2 * | 12/2019 | Lin ................ H01J 37/32715 |
| 2002/0043750 A1 | 4/2002 | Lenz |
| 2002/0072240 A1 * | 6/2002 | Koike ............. H01J 37/32642 438/710 |
| 2002/0146970 A1 | 10/2002 | Saldana et al. |
| 2003/0032379 A1 | 2/2003 | Taylor et al. |
| 2004/0053428 A1 * | 3/2004 | Steger ............. H01J 37/32623 438/10 |
| 2004/0102138 A1 | 5/2004 | Saldana et al. |
| 2004/0125360 A1 * | 7/2004 | Ludviksson ...... H01J 37/32963 356/72 |
| 2005/0041238 A1 * | 2/2005 | Ludviksson ............ G01N 21/64 356/72 |
| 2005/0056622 A1 | 3/2005 | Steger |
| 2005/0222781 A1 * | 10/2005 | Yue .................... G05B 13/041 702/30 |
| 2006/0171848 A1 * | 8/2006 | Roche .............. H01J 37/32935 422/98 |
| 2007/0249071 A1 * | 10/2007 | Lian .................... H01L 22/12 438/16 |
| 2008/0179297 A1 | 7/2008 | Bailey et al. |
| 2008/0236749 A1 * | 10/2008 | Koshimizu ....... H01J 37/32642 156/345.33 |
| 2009/0078196 A1 * | 3/2009 | Midorikawa ..... H01L 21/30655 118/708 |
| 2010/0304572 A1 * | 12/2010 | Koshimizu ....... H01J 37/32091 438/710 |
| 2011/0253181 A1 | 10/2011 | Obweger et al. |
| 2011/0304107 A1 | 12/2011 | Obweger et al. |
| 2012/0043021 A1 | 2/2012 | Cirigliano |
| 2012/0185813 A1 | 7/2012 | Kaushal ................. G06N 20/00 716/112 |
| 2014/0051253 A1 | 2/2014 | Guha |
| 2014/0106477 A1 * | 4/2014 | Chen ................ H01L 21/67069 438/9 |
| 2014/0235063 A1 | 8/2014 | McMillin et al. |
| 2014/0367279 A1 | 12/2014 | Brogan et al. |
| 2015/0004721 A1 * | 1/2015 | Akimoto ........... H01J 37/32972 438/9 |
| 2015/0118012 A1 | 4/2015 | Hawkins |
| 2015/0122638 A1 | 5/2015 | Dinneen et al. |
| 2015/0122658 A1 | 5/2015 | Kim et al. |
| 2015/0170958 A1 | 6/2015 | Stumpf |
| 2015/0348772 A1 | 12/2015 | Kolics |
| 2017/0140905 A1 * | 5/2017 | Mihaylov ......... H01J 37/32972 |
| 2017/0213753 A1 * | 7/2017 | Rogers ............ H01J 37/3288 |
| 2017/0213758 A1 * | 7/2017 | Rice ................ H01J 37/32715 |
| 2017/0256463 A1 * | 9/2017 | Bailey, III ............. H01L 22/26 |
| 2017/0263478 A1 * | 9/2017 | McChesney ...... H01J 37/32623 |
| 2018/0061696 A1 * | 3/2018 | D'Ambra .......... H01J 37/32798 |
| 2018/0190475 A1 * | 7/2018 | Shin .................... H01J 37/32642 |
| 2019/0363003 A1 * | 11/2019 | Sarode Vishwanath .................... H01L 21/6833 |

* cited by examiner

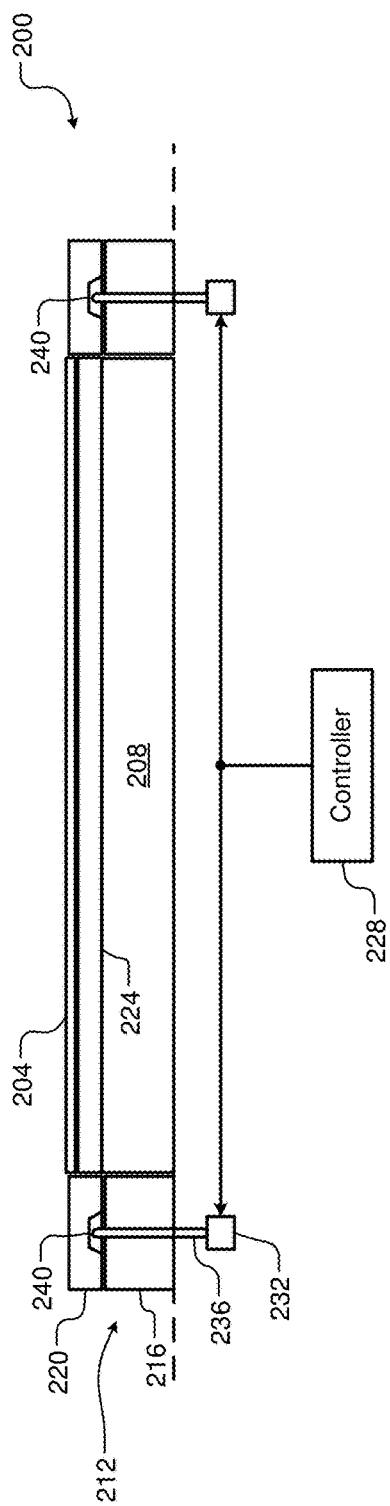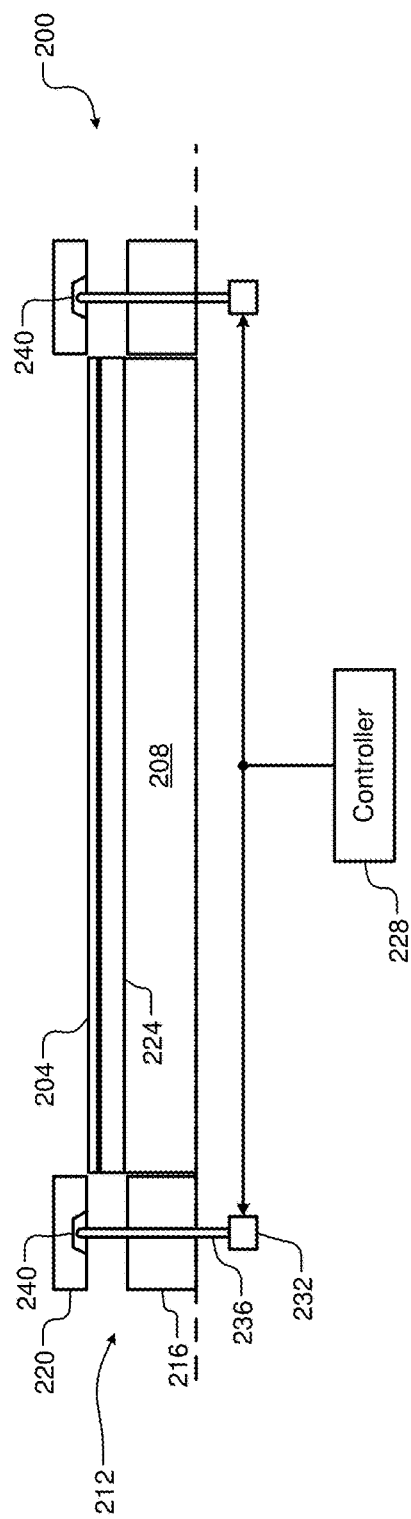

US 10,903,050 B2

ENDPOINT SENSOR BASED CONTROL INCLUDING ADJUSTMENT OF AN EDGE RING PARAMETER FOR EACH SUBSTRATE PROCESSED TO MAINTAIN ETCH RATE UNIFORMITY

FIELD

The present disclosure relates to etch rate uniformity in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, rapid thermal processing (RTP), ion implant physical vapor deposition (PVD), and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, shape and position a plasma sheath, etc.

SUMMARY

A substrate processing system is provided and includes a model generation module and a setpoint module. The model generation module is configured to receive a first time trace based on an output of an endpoint sensor and obtain a target setpoint. A portion of the first time trace is indicative of an endpoint at which a feature has been created in a first layer of a first substrate. The target setpoint is generated based on a metrology process and is used to compensate for erosion of a first edge ring of a substrate support. The model generation module is configured to generate a conversion model based on the portion of the first time trace and the target setpoint. The setpoint module is configured to: receive a second time trace based on the output of the endpoint sensor, where the second time trace is generated subsequent to generation of the first time trace; and based on the conversion model, convert the second time trace to a predicted erosion compensation setpoint, where the predicted erosion compensation setpoint is set while processing a second substrate using the first edge ring or a second edge ring.

In other features, a method of operating a substrate processing system is provided. The method includes: receiving a first time trace based on an output of an endpoint sensor, where a portion of the first time trace is indicative of an endpoint at which a feature has been created in a first layer of a first substrate; obtaining a target setpoint, where the target setpoint is generated based on a metrology process and is used to compensate for erosion of a first edge ring of a substrate support; generating a conversion model based on the portion of the first time trace and the target setpoint; and receiving a second time trace based on the output of the endpoint sensor. The second time trace is generated subsequent to generation of the first time trace. The method further includes, based on the conversion model, converting the second time trace to a predicted erosion compensation setpoint. The predicted erosion compensation setpoint is set while processing a second substrate using the first edge ring or a second edge ring.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is a cross-sectional side view of an example of a moveable edge ring in accordance with an embodiment of the present disclosure;

FIG. 2B is a cross-sectional side view of the moveable edge ring of FIG. 2A in a raised position;

In the drawings, reference numbers may be reused to identify similar and/or identical elements.

DETAILED DESCRIPTION

Figure 1:
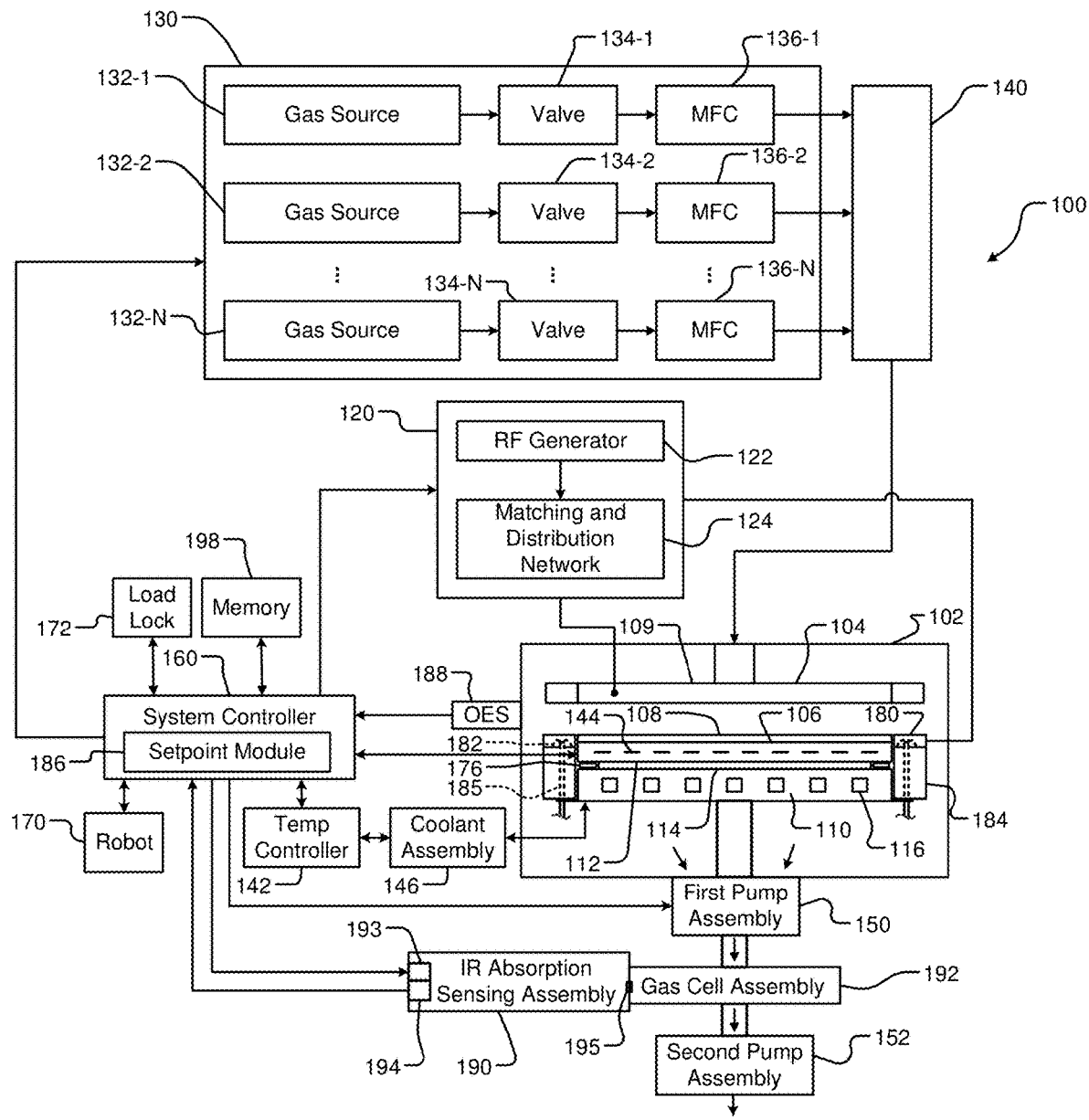
FIG. 1 is a functional block diagram of an example of a substrate processing system including endpoint sensors and a setpoint module in accordance with an embodiment of the present disclosure.

A substrate support in a substrate processing system may include an edge ring. The edge ring may include consumable materials that wear/erode over time. More surface area exists near an outer edge (or perimeter) of a substrate than near a center of the substrate. As a result, a substrate may experience a higher etch rate near a center of the substrate than at an edge of the substrate. Etch rate uniformity (hereinafter "uniformity") at and/or near edges of substrates tends to decrease over time due to erosion of the edge ring. Erosion of the edge ring includes rounding of upper corners of the edge ring, removal of material from a top portion of the edge ring, and grooving and angling of a top surface of the edge ring. In addition, tilt angles of holes, being formed near the edges of the substrates during etching, can increase in magnitude away from a vertical (or 0° tilt angle) orientation. Rates of erosion are not linear and can accelerate near an end of a life span of an edge ring.

To compensate for erosion, a height of an edge ring or a radio frequency (RF) voltage of the edge ring may be adjusted. For example, in a conductor etch (CE) chamber, the edge ring may be moveable (e.g., tunable) and/or replaceable. In this example, a height of the edge ring relative to a substrate and/or a substrate support may be adjusted (or increased) to maintain and/or control etch rate uniformity, shape of a plasma sheath, and/or an ion tilt angle. The edge ring may be moved upward such that a top surface of the edge ring is at a same or higher height than an initial height of a top surface of the edge ring prior to erosion. An actuator may raise the edge ring via, for example, lift pins. As another example, in a dielectric etch (DE) chamber, a magnitude of an RF voltage that is applied to the edge ring may be increased to control etch uniformity, shape of a plasma sheath, and/or an ion tilt angle. In this example, the edge ring may be formed of a conductive material and operate as a ring-shaped electrode.

Edge rings may be removable and replaceable. This allows the edge rings to be replaced when in an eroded and/or damaged state such that the edge rings have unusable geometries. The term "removable" as used herein refers to the ability of an edge ring to be removed from a processing chamber while under vacuum using, for example, a vacuum transfer arm. As an example, the edge ring may be lifted via lift pins to a height at which the vacuum transfer arm is able to move the edge ring out of the corresponding processing chamber and replace the edge ring with another edge ring.

In order to determine the appropriate height and/or RF voltage, a metrology process is performed. As a first example, a first (or low) height of an edge ring is set, a first substrate is then etched, and a first uniformity value or tilt angle corresponding to etching performed at and/or near an edge of the substrate is determined. The first tilt angle may be a negative tilt angle. The height of the edge ring is then adjusted to a second (or high) height. A second substrate is then etched and a second uniformity value or tilt angle corresponding to etching performed at and/or near an edge of the second substrate is determined. The second tilt angle may be a positive tilt angle. A setpoint height is then determined based on the first and second uniformity values to maximize uniformity and/or minimize the magnitude of the tilt angle. The setpoint height may be estimated using, for example, a linear or non-linear model. The setpoint height may be a height between the first and second heights. The first and second heights may correspond respectively to first and second points on a line relating heights to uniformity values or tilt angles. A first axis of a graph having the line may be height and a second axis may be uniformity or tilt angle. The line may be linear or non-linear.

As another erosion compensation example, in a dielectric etch environment a first RF voltage for a first substrate is set, the first substrate is then etched, and a first uniformity value or tilt angle of etch at and/or near an edge of the substrate is determined. The first tilt angle may be a negative tilt angle. The RF voltage of the edge ring is then adjusted to a second (or high) RF voltage, a second substrate is then etched, and a second uniformity value or tilt angle of etch at and/or near an edge of the second substrate is determined. The second tilt angle may be a positive tilt angle. A setpoint RF voltage is then determined based on the first and second uniformity values to maximize uniformity and/or minimize the magnitude of the tilt angle. The setpoint RF voltage may be estimated using, for example, a linear or non-linear model. The setpoint RF voltage may be a RF voltage between the first and second RF voltages. The first and second RF voltages may correspond respectively to first and second points on a line relating RF voltages to uniformity values or tilt angles. A first axis of a graph having the line may be RF voltage and a second axis may be uniformity or tilt angle. The line may be linear or non-linear.

The stated example metrology processes are time consuming and are traditionally performed periodically to adjust compensation target values. For example, the stated metrology processes may be performed after processing a predetermined number of substrates. If the uniformity value decreases below a first predetermined threshold and/or a magnitude of the tilt angle increases above a second predetermined threshold, then a wet clean process may be performed including replacement of the edge ring.

Examples set forth herein include systems and methods for adjusting erosion compensation setpoint values (e.g., edge ring heights, RF voltages, and/or other edge ring parameters). The erosion compensation setpoint values may be referred to as tunable edge shift (TES) values. The erosion compensation setpoint values are adjusted for each substrate. As a result, the erosion compensation setpoint values are substrate specific. The above-stated metrology processes may be performed a single time to provide target setpoint values that are used along with time sequence signatures to create one or more models. The time sequence signatures are generated based on outputs from endpoint sensors (e.g., an optical emission spectrometer or an infrared absorption sensor). The model(s) are then used to perform the stated adjustments. After the model(s) are created, the adjustments are made without performing the stated metrology processes.

Time sequence signatures generated based on outputs from an endpoint sensor, such as outputs of an optical emission spectrometer (OES) and/or an infrared (IR) absorption sensor, may be used to detect endpoints of an etching process and etch rate uniformity. Although the following examples are described primarily with the use of an OES and/or an IR absorption sensor, other endpoint (EP) detection sensors may be used. An EP may refer to, for example, a transition point between two different layers of a substrate. The first layer may be formed of one or more different materials and/or have a different concentration of materials than the second layer. Holes (or channels) may be etched in a substrate beginning in the first layer and stopped upon reaching the second layer. At the endpoint pressures in processing gases, overall impedance of plasma and/or plasma chamber, concentration of plasma reactants and products, and reflective properties of surfaces of the substrate may experience step (or short, abrupt and/or significant) changes in value. Any of these various changes may be detected using one or more EP detection sensors. Each substrate has a unique EP signature.

EP detection may be implemented to compensate for substrate variability and/or processing chamber variability (chamber to chamber variability and/or variability within a same chamber over time). Because some chamber parts get eroded over time, etch rate uniformity at edges of substrates can be impacted due to sheath deformation at transition points between the substrate and processing chamber parts.

Over-etching results when the etching process is not stopped upon reaching the second layer. This can cause etching of the second layer, bowing outward of channel walls, and/or irregularities in channel walls. Detection of the endpoint is also helpful in accounting for variability between substrates, between processing chambers and in the same processing chamber over time. Since parts of a processing chamber can erode over time, etch rates can also vary over time.

FIG. 1 shows a substrate processing system 100, which, as an example, may perform etching using RF plasma and/or perform other substrate processing operations. The substrate processing system 100 includes a substrate processing chamber 102 that encloses some of the elements/parts of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and substrate processing chamber 102 are shown as an example, the principles of the present disclosure may be applied to other types of substrate processing systems and chambers.

For example only, the upper electrode 104 may include a gas distribution device such as a showerhead 109 that introduces and distributes process gases (e.g., etch process gases). The showerhead 109 may include a stem portion including one end connected to a top surface of the substrate processing chamber 102. A base portion is generally cylindrical and extends radially outwardly from an opposite end of the stem portion at a location that is spaced from the top surface of the substrate processing chamber 102. A substrate-facing surface or faceplate of the base portion of the showerhead 109 includes holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer (or top plate) 112. In some examples, the ceramic layer 112 may include a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more gases (e.g., etch gas, carrier gases, purge gases, etc.) and mixtures thereof. The gas sources may also supply purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the substrate processing chamber 102. For example only, the output of the manifold 140 is fed to the showerhead 109.

A temperature controller 142 may be connected to heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may control power to the heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A first pump assembly 150 and second pump assembly 152 may be used to evacuate reactants from the substrate processing chamber 102. The pump assemblies 150, 152 may each include a pump and one or more valves. In one embodiment, the first pump assembly 150 includes a turbo pump and the second pump assembly includes a rough pump. A system controller 160 may be used to control elements, parts, and/or devices of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the thermal resistance layer 114 between the ceramic layer 112 and the baseplate 110.

The substrate support 106 may include an edge ring 180. The edge rings disclosed herein are annularly-shaped including the edge ring 180. The edge ring 180 may be a top ring, which may be supported by a bottom ring 184. In some examples, the edge ring 180 may be further supported by one or more middle rings (not shown in FIG. 1) and/or other portions of the substrate support 106. The edge ring 180 may include pin receiving elements 182 that receive top ends of lift pins 185 and thus the edge ring 180 may be moveable (e.g., moveable upward and downward in a vertical direction) relative to the substrate 108. For example, the edge ring 180 may be controlled via an actuator responsive to the system controller 160. In some examples, the edge ring 180 may be vertically moved during substrate processing (i.e., the edge ring 180 may be tunable). In one embodiment, the edge ring 180 is not vertically movable. The edge ring 180 may not include lift pin receiving elements. In other examples, the edge ring 180 may be removable using, for example, the robot 170, via an airlock, while the substrate processing chamber 102 is under vacuum. In still other examples, the edge ring 180 may be both tunable and removable.

The system controller 160 may include a setpoint module 186, which may set erosion compensation values associated with, for example, heights of the edge ring 180 and/or RF voltages applied to the edge ring 180. The edge ring 180 may receive an RF voltage from the matching and distribution network 124. The height of the edge ring 180 relative to the substrate support 106 and/or the substrate 108 may be adjusted and/or the RF voltage may be applied to the edge ring 180 to compensate for erosion of the edge ring 180.

An OES (also referred to as a "sensor") 188 and/or an IR absorption sensing assembly 190 may be included as shown. The OES 188 may be, for example, implemented on a side of the substrate processing chamber 102 and detect light within the substrate processing chamber 102 and provide a first output signal to the setpoint module 186. The OES 188 may detect, for example, light having wavelengths of 200-900 nanometers. The first output signal of the OES 188 has different frequency spectrum associated with different chemical species detected in the plasma. The OES 188 may be used, for example, in a conductor etch environment and when creating features (e.g., holes, trenches, etc.) with low aspect ratios. The IR absorption sensing assembly 190 may be connected to a gas cell assembly 192, which is in an exhaust path of the substrate processing chamber 102. Gas exhausted from the substrate processing chamber 102 is passed through the gas cell assembly 192. The IR absorption sensing assembly 190 may include a light source (e.g., an infrared laser 193), steering mirrors, an iris to control light intensity, and one or more detectors (referred to as IR absorption sensors; one IR absorption sensor 194 is shown).

The gas cell assembly 192 may include a gas cell (or housing) and reflecting mirrors. The reflecting mirrors are used to increase a distance that the light from the light source travels through the gas within the gas cell. Absorption of the gases in the gas cell increases with distance of travel of the light from the light source. As an example, the gas cell may be 20 centimeters long (from a light receiving side of the gas cell to an opposite side of the gas cell) and include reflecting mirrors, such that the light from the light source is reflected multiple times and travels 10 meters before being reflected back to the one or more detectors (or IR absorption sensor 194). The reflecting mirrors may be on the receiving and opposite sides of the gas cell. The IR absorption sensing assembly 190 may include one or more windows (one window 195 is shown) through which light may be transmitted into the gas cell and received from the gas cell. Although the IR absorption sensing assembly 190 is shown including the light source 193 and the IR absorption sensor 194 on a same side of the gas cell assembly 192, the IR absorption sensor 194 may be on an opposite side of the gas cell assembly 192 as the light source 193.

The IR absorption sensor 194 may be used to measure a concentration by product of an etch process. The IR absorption sensor 194 may detect light in an infrared spectrum, such as light having a wavelength of, for example, 10 micrometers. The output signal of the IR absorption sensor 194 may be based on a flow line pressure of gas passing through the gas cell. The IR absorption sensor 194 may be used, for example, in a dielectric etch environment and when creating features (e.g., holes) with high aspect ratios. A high aspect ratio refers to when feature being created has a depth that is much larger than a diameter of the hole. This applies to applications, for example, when memory devices are being manufactured. In high aspect ratio environments, the deeper the hole, the slower the etch rate. The aspect ratios of the features monitored using the IR absorption sensor 194 may be higher than the aspect ratios of the features monitored by the OES 188.

The IR absorption sensing assembly 190 may generate an infrared light beam via the light source 193. The light beam is transmitted into the gas cell of the gas cell assembly 192 and reflected back to the IR absorption sensor 194, which then generates a second output signal. The system controller 186 may control operation of the light source 193 and receive the output of the IR absorption sensor 194. The gases exhausted from the substrate processing chamber 102 may be passed through the first pump assembly 150, through the gas cell of the gas cell assembly 192 and to the second pump assembly 152. The output signals of the OES 188 and the IR absorption sensor 194 are indicative of the concentrations within respectively the substrate processing chamber 102 and the exhaust path. The output signals may be provided to the system controller 160 and/or the setpoint module 186, which may than convert the voltages, current levels, amplitudes, etc. of output signals to counts to provide time traces referred to herein. Example time traces are shown in FIGS. 3-6 and 9. The output signals and/or time traces may be stored in memory 198. The memory 198 may be implemented in one of the system controller 160 and/or may be separate from the system controller 160, as shown.

FIGS. 2A and 2B show an example substrate support 200 having a substrate 204 arranged thereon is shown. The substrate support 200 may include a base or pedestal having an inner portion (e.g., corresponding to an ESC) 208 and an outer portion 212. In examples, the outer portion 212 may be independent from, and moveable in relation to, the inner portion 208. For example, the outer portion 212 may include a bottom ring 216 and a top edge ring 220. The substrate 204 is arranged on the inner portion 208 (e.g., on a ceramic layer (or top plate) 224) for processing. A controller 228 (e.g., the system controller 160 of FIG. 1) controls operation of one or more actuators 232 to selectively raise and lower the edge ring 220. For example, the edge ring 220 may be raised and/or lowered to adjust a pocket depth of the substrate support 200 during processing. In another example, the edge ring 220 may be raised to facilitate removal and replacement of the edge ring 220.

For example only, the edge ring 220 is shown in a fully lowered position in FIG. 2A and in a fully raised position in FIG. 2B. As shown, the actuators 232 correspond to pin actuators configured to selectively extend and retract lift pins 236 in a vertical direction. For example only, the edge ring 220 may be formed of ceramic, quartz and/or other suitable materials (e.g., silicon carbide, yttria, etc.). In FIG. 2A, the controller 228 communicates with the actuators 232 to directly raise and lower the edge ring 220 via the lift pins 236. In some examples, the inner portion 208 is moveable relative to the outer portion 212.

Figure 6:
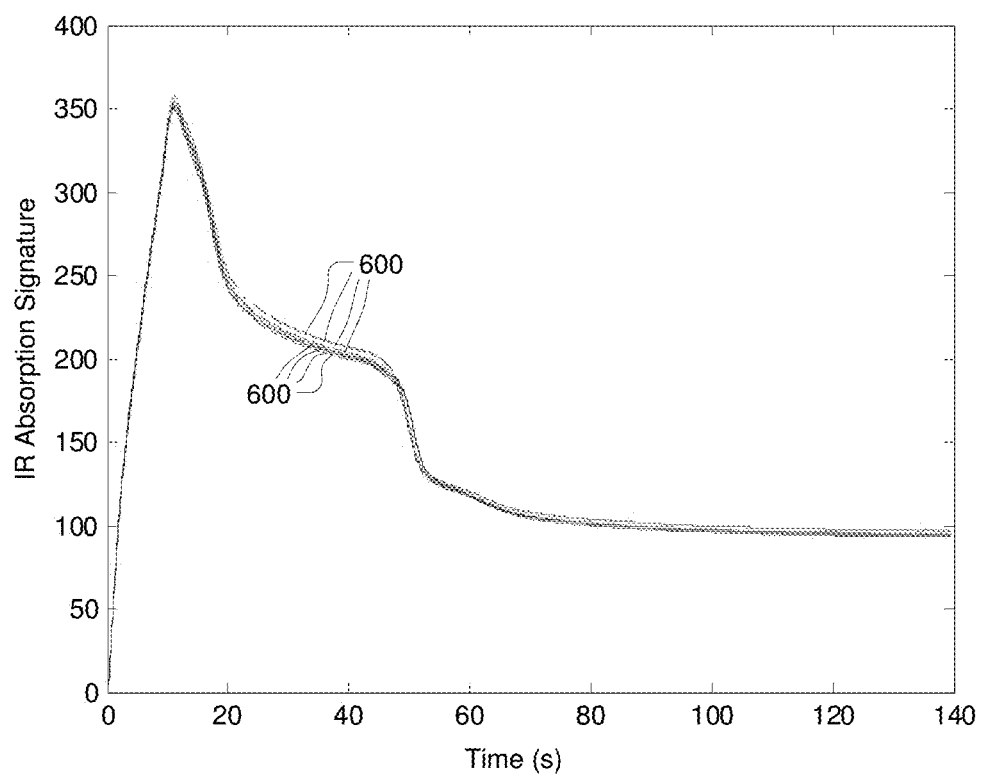
FIG. 6 is an example of overlaid time trace plots generated based on outputs of an IR absorption sensor illustrating differences in signatures for multiple successive etch operations on respective substrates using a same edge ring.

The edge ring 220 includes lift pin receiving elements 240 that receive top ends of the lift pins 236. The edge ring 220 may include three or more lift pin receiving elements for receiving three or more lift pins. In one embodiment, the edge ring 220 includes three lift pin receiving elements that receive respectively three lift pins. The three lift pin receiving elements may be disposed 120° apart from each other (an example of this arrangement is shown in FIG. 6). The lift pin receiving elements 240 may include grooves, divots, pockets, notches, recessed regions, and/or other suitable lift pin receiving elements.

Figure 3:
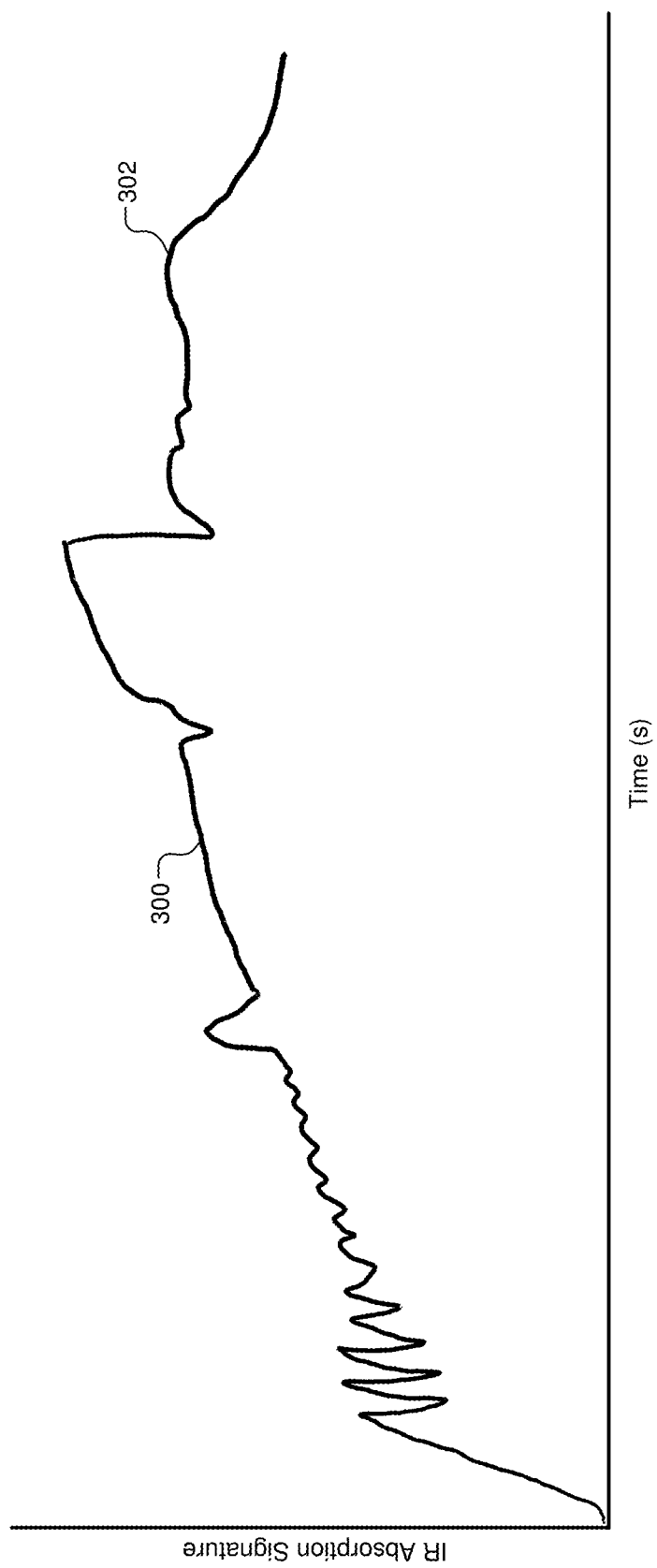
FIG. 3 is an example of a time trace plot generated based on an output of an IR absorption sensor and illustrating an IR absorption signature at an endpoint and during over etching.

FIG. 3 shows an example time trace plot 300 generated based on an output of an IR absorption sensor. The setpoint module 186 of FIG. 1 may receive this signal from the IR absorption sensor 194 and detect an etching endpoint and/or an over etch period based on this output. The setpoint module 186 may have stored in memory an estimated time frame of when the endpoint should occur and/or other time trace (or signature) features, such as patterns, amplitudes, durations, slopes, maximums, minimums, etc. In the example shown, an endpoint has occurred at a last peak 302 of the time trace 300. Etching performed subsequent to the peak 302 occurs during an over etching period. Thus, trace dynamics near the last peak 302 are monitored.

Figure 4:
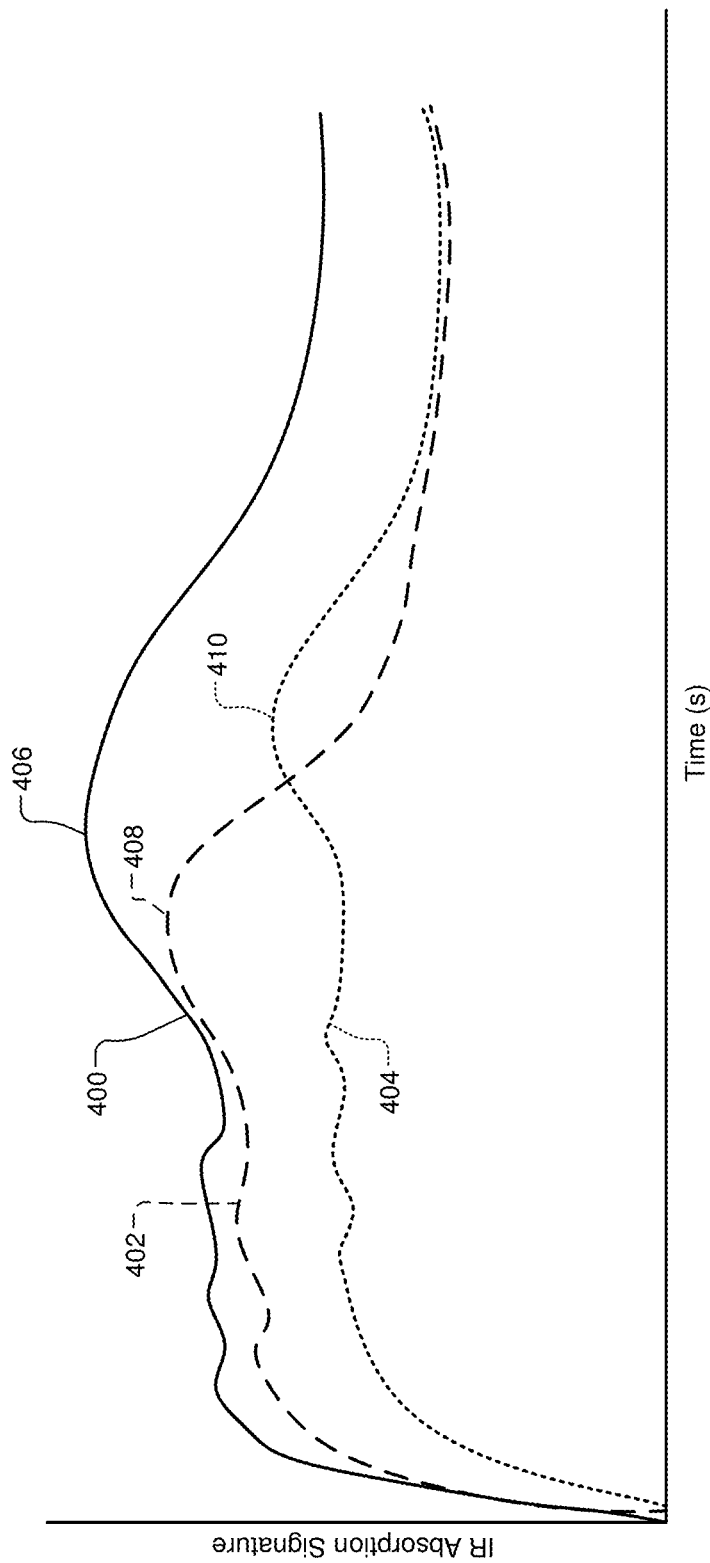
FIG. 4 is an example of three overlaid time trace plots generated based on outputs of an IR absorption sensor illustrating differences in endpoint signatures for three successive etch operations on respective substrates using a same edge ring.

FIG. 4 shows three example overlaid time trace plots 400, 402, 404 of IR absorption signatures generated based on outputs of an IR absorption sensor. The time trace plots 400, 402, 404 are later portions of an etch process and illustrate differences in endpoint signatures for three successive etch operations on respective substrates using a same edge ring. The time trace plots 400, 402, 404 have peaks 406, 408, 410 that correspond to etch endpoints. As shown, although the same etch process is performed on each substrate using a same etch ring, the peaks 406, 408, 410 occur at different times, have different magnitudes, and the corresponding portions of the time traces have different shape. This is primarily due to erosion of the edge ring. To compensate for the stated differences, heights of the edge ring and/or RF voltages applied to the edge ring may be adjusted.

Figure 5:
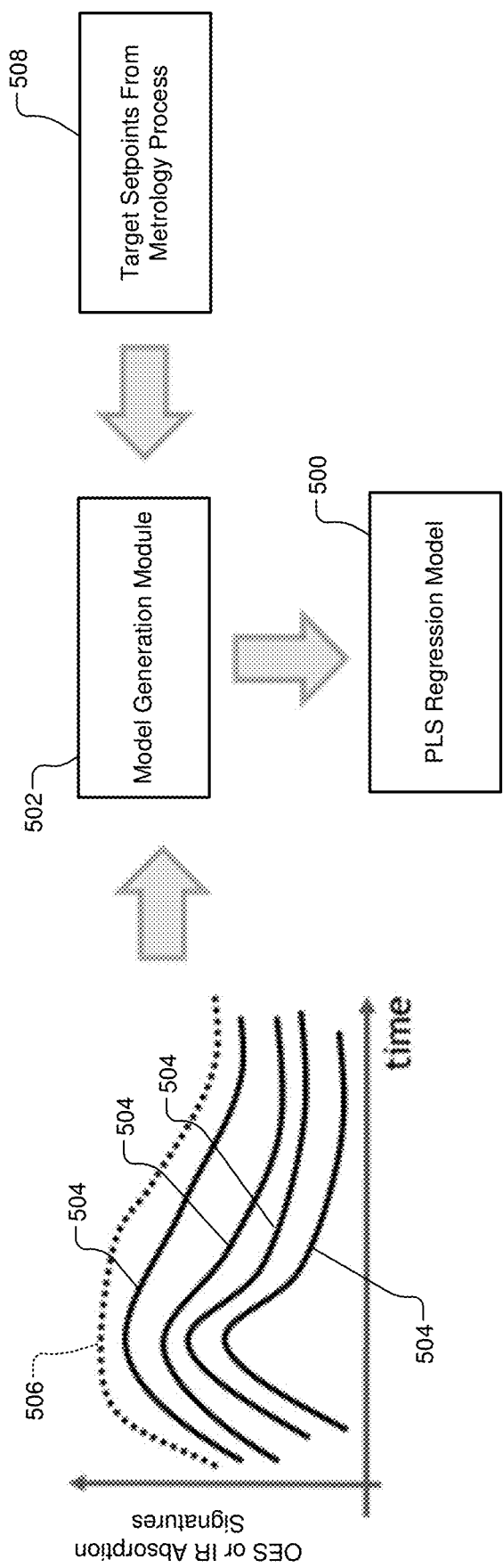
FIG. 5 is an example of a modeling diagram illustrating creation of a partial least squares (PLS) regression model in accordance with an embodiment of the present disclosure.

FIG. 5 shows an example modeling diagram illustrating creation of a partial least squares (PLS) regression model 500. A model generation module 502 may receive as inputs time traces 504 generated based on the output of an endpoint sensor (e.g., an output of the OES 188 or the IR absorption sensor 194 of FIG.1). Dashed trace 506 indicates that any number of time traces may be provided. The model generation controller 502 may be implemented as part of one of the system controller 160 and the setpoint module 186 of FIG. 1 and generates the PLS regression model 500 based on the time traces 504 and target setpoints 508. The target setpoints 508 may be stored in memory and provided as a result of performing a metrology process, such as one of the metrology processes described above.

As an example, an edge ring may be used to etch multiple substrates using a traditional approach including periodically performing a metrology process to adjust erosion compensation setpoints. The resulting erosion compensation setpoints used to perform the same etch process on the stated substrates may be stored in memory and then used by the model generation module 502 to create the PLS regression model 500. The PLS regression model can then be used as further described below to convert values of a time trace to an erosion compensation value, which may then be used for a next substrate being processed. In another embodiment, the PLS regression model is used to convert values of a time trace to a uniformity value or tilt angle.

In one embodiment, the substrates that can be etched for a usable life of a first edge ring are processed and corresponding time traces from endpoint sensors and generated erosion compensation setpoints are stored. A wet clean process is then performed where the first edge ring is replaced with a second edge ring. A conversion model (e.g., the PLS regression model) is generated based on the time traces and erosion compensation setpoints. During processing of subsequent substrates, the conversion model is used to generate an updated erosion compensation setpoint for each substrate processed.

Figure 7:
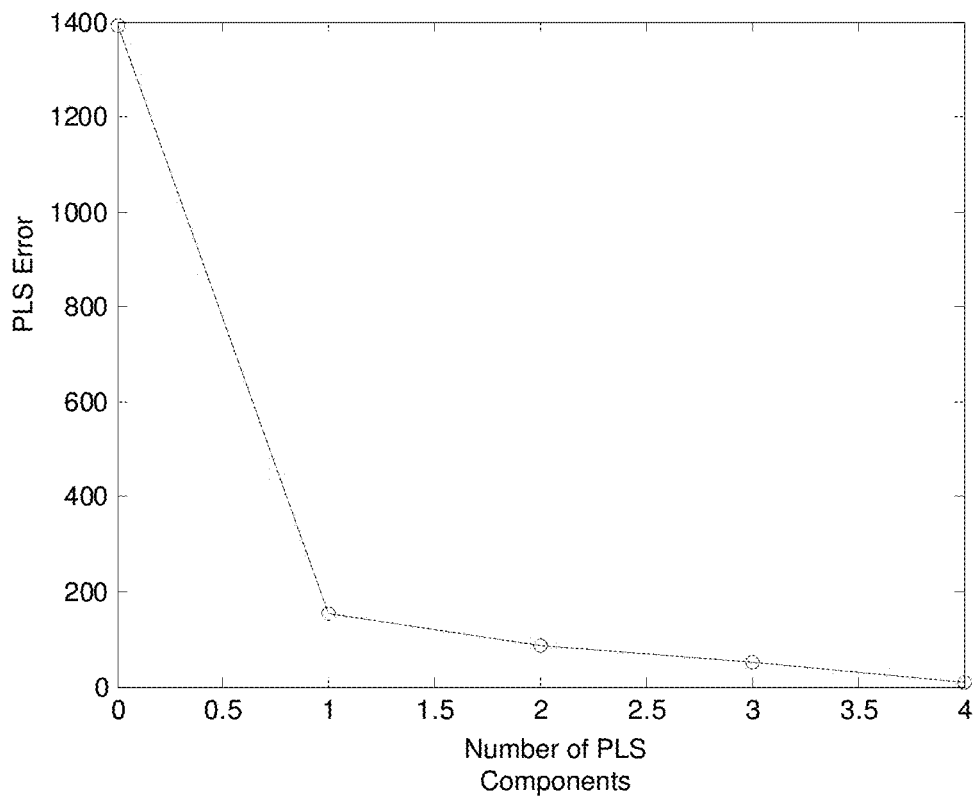
FIG. 7 is an example plot of PLS error versus a number of PLS components for the time trace plots of FIG. 6.

FIG. 6 shows example overlaid time trace plots 600 generated based on outputs of an IR absorption sensor illustrating differences in signatures for multiple successive etch operations on respective substrates using a same edge ring. As shown, there are variations in the shapes of the time traces 600. These variations are primarily due to erosion of a corresponding edge ring over time. FIG. 7 shows an example plot of PLS error versus a number of PLS components for the time trace plots 600 of FIG. 6. The different numbers of PLS components are associated with respective PLS regression models. For the same amount of PLS error, more PLS components may be associated with a PLS regression model generated for an OES than a number of PLS components of a PLS regression model generated for an IR absorption sensor. FIG. 7 illustrates that the more PLS components included in a PLS regression model, the more accurate is the PLS regression model. Also, in this example, having 4 or more components provides a PLS regression model with high accuracy in predicting erosion compensation setpoints, such that the PLS error is less than 1-5% relative to target setpoints.

Figure 8:
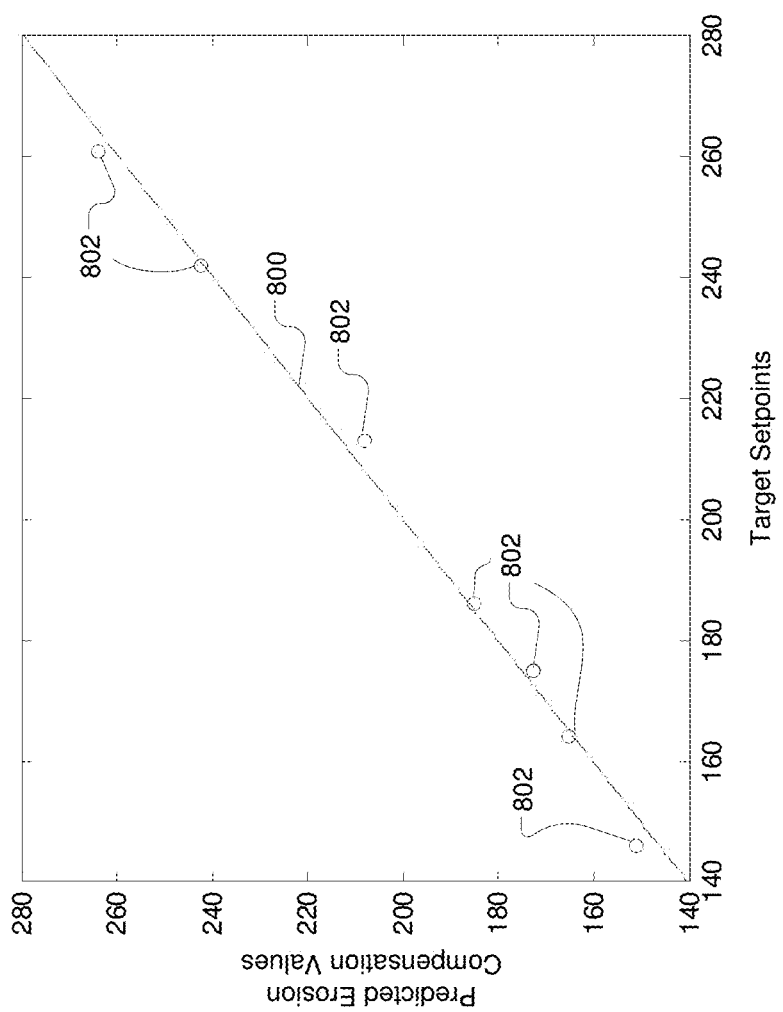
FIG. 8 is an example plot of predicted erosion compensation values versus target setpoints in accordance with an embodiment of the present disclosure.

FIG. 8 shows an example plot 800 of predicted erosion compensation values versus target setpoints. The plot 800 is a linear curve illustrating a 1:1 ratio between the predicted erosion compensation values and target setpoints (or setpoints for a maximum accuracy in predicting endpoints). The circles 802 represent actual data point comparisons for example where the corresponding PLS regression model included 4 PLS components. As shown, the data points closely follow the linear curve for a 1:1 ratio.

Figure 9:
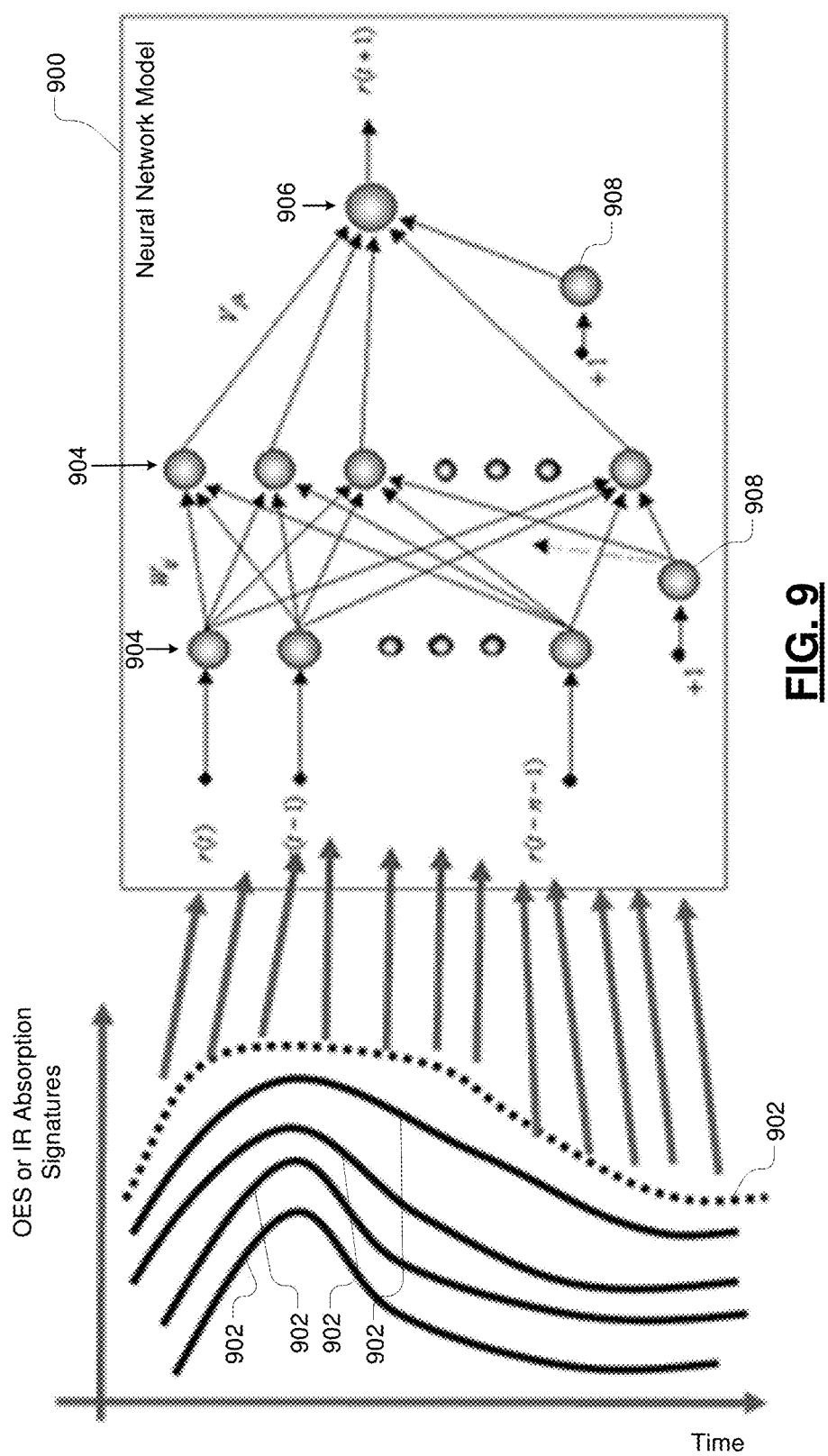
FIG. 9 is an example of an endpoint sensor time sequence to erosion compensation setpoint conversion diagram for a neural network in accordance with an embodiment of the present disclosure.

FIG. 9 shows an example endpoint sensor time sequence to erosion compensation setpoint conversion diagram for a neural network. The setpoint module 186 of FIG. 1 may use various techniques to create a conversion model for converting endpoint sensor time sequences to erosion compensation setpoints, uniformity values and/or tilt angles. FIG. 9 illustrates another example technique, where a neural network model 900 is used. Time traces 902 generated based on an output of an endpoint sensor are provided to a neural network model 900. The neural network model 900 may include multiple weighting levels (e.g., two levels 904 are shown). The weights of the weighting levels may be determined during a learning phase when the neural network model 900 is generated. This may occur, as described above, when etching substrates using a first edge ring. Time traces are monitored and target setpoints determined from periodically performing a metrology process are stored.

In the example shown, the variable r is the number of counts for the corresponding time trace, t is time, n is an integer, $W_y$ are weighted results based on first weights (or coefficients), $V_{jk}$ are weighted results based on second weights (or coefficients), and y, j and k are integers used to identify the weight resultant values. The final level (designated 906) of the neural network model 900 is a summer and used to generate output values, such as updated erosion compensation setpoint values, uniformity values, or tilt angles. Bias inputs 908 may be included.

FIGS. 6-9 are associated with a couple of different conversion models. Other linear and/or non-linear models may be implemented. Various artificial intelligence and/or machine learning algorithms including regression algorithms may be used to create the models for matching time traces generated based on outputs of endpoint sensors to erosion compensation setpoints. In one embodiment, portions of one or more linear and/or nonlinear models may be combined to provide a single overall model. The portions of the linear and/or nonlinear models may be based on one or more parameters, such as a number of RF operations hours of a corresponding edge ring.

Figure 10:
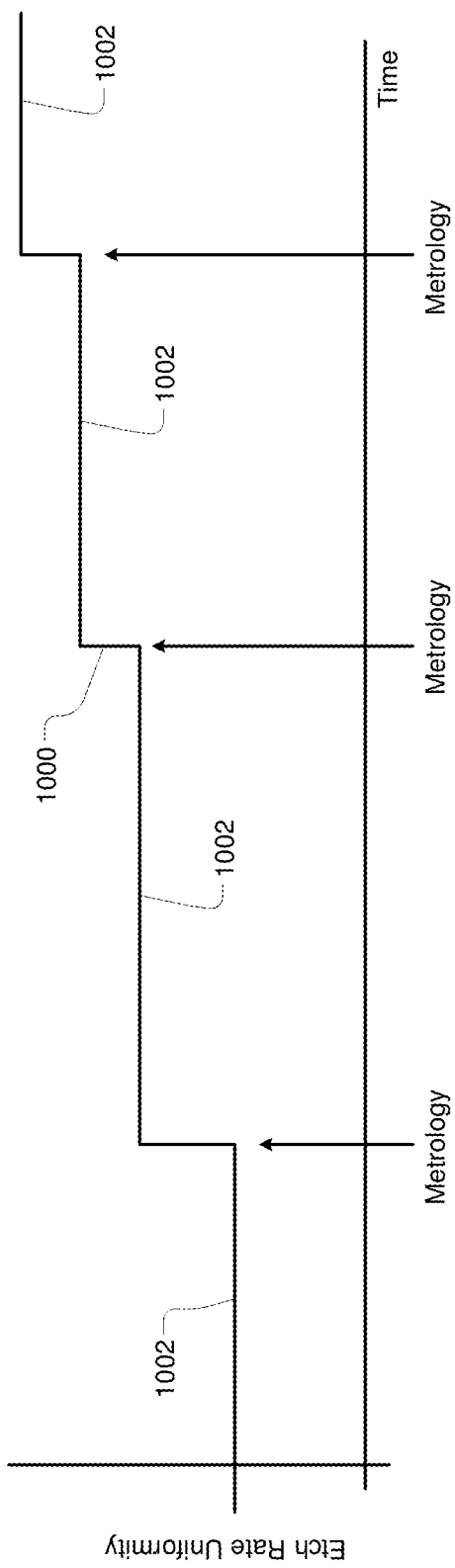
FIG. 10 is an example plot of etch rate uniformity versus time illustrating periodic performance of a metrology process.

FIG. 10 is an example plot of etch rate uniformity versus time 1000 illustrating periodic performance of a metrology process. If etch rate is uniform for a certain number of substrates using a same edge ring, then the corresponding uniformity curve is linear and horizontal. This is illustrated by the plot 1000, which is a stepped curve having four horizontal linear portions 1002. Each of the horizontal linear portions 1002 is associated with etching multiple substrates using a same edge ring. Different edge rings are associated with the respective horizontal linear portions 1002. After a predetermined number of substrates have been etched or a predetermined period of time (referred to as a predetermined number of RF hours of operation) has lapsed, a metrology process is performed. The current edge ring may or may not be replaced when the metrology process is performed. A low sampling rate is provided due to the use of metrology. As a result, the erosion compensation setpoints for certain substrates may be used for other substrates. Thus, the erosion compensation setpoints are not specific to the other substrates and provide limited corresponding etch rate uniformity performance.

Figure 11:
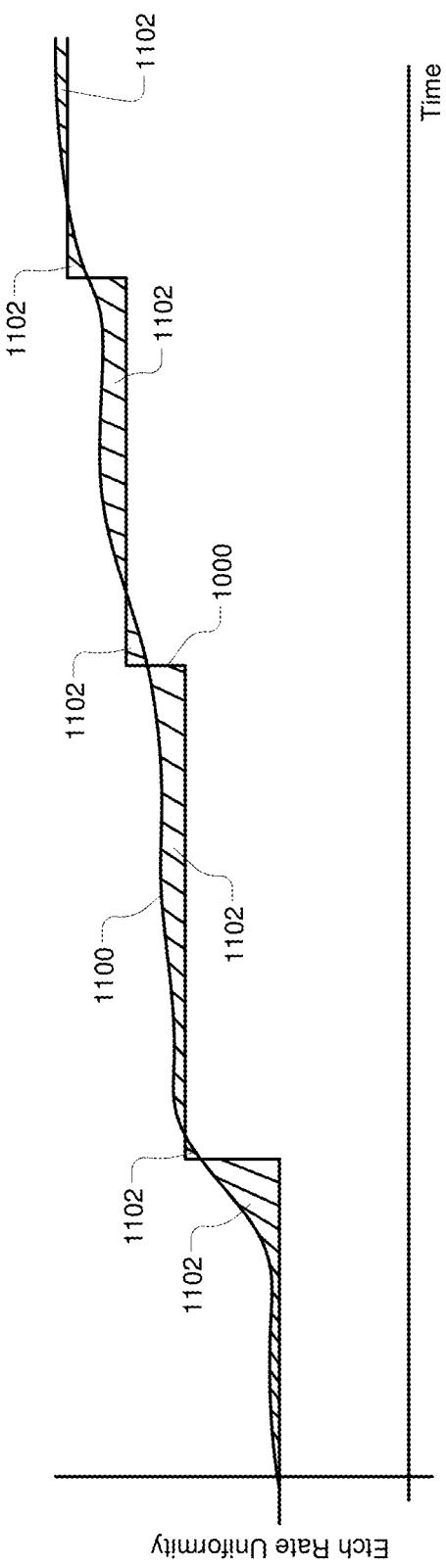
FIG. 11 is an example plot of etch rate uniformity versus time illustrating adjustments of erosion compensation setpoints for each substrate in accordance with an embodiment of the present disclosure.

In reality, etch rate uniformity is not consistent from substrate to substrate. As a result, erosion compensation values determined traditionally during metrology processes have limited and diminishing accuracy relative to what the erosion compensation setpoints should be for each substrate. In other words, the difference between predicted erosion compensation setpoints and target setpoints can be high depending on the substrate. This difference is illustrated in FIG. 11. The error can increase from substrate to substrate until a metrology process is performed. The examples set forth herein include adjusting the erosion compensation values for each substrate.

The etch rate uniformity may be determined using different techniques. Uniformity may be determined, for example, based on slopes of time traces of endpoint sensors, based on widths of curves corresponding to peaks (e.g., full width at half maximums) of the time traces, and/or other time trace parameters. As an example a width of a curve corresponding to a peak may refer to a distance (or amount of time) between (i) a first point on a rising (positive slope) portion of the curve prior to the peak, and (ii) a second point on a falling (negative slope) portion of the curve subsequent to the peak. Uniformity may also be determined using various algorithms, such as a partial least squares algorithm. The less uniform the etch rate across a surface of a substrate, the more compensation is provided. This may include, for example, increasing a height of an edge ring relative to a substrate support and/or substrate and/or increasing an RF voltage applied. The more non-uniform an etching processing, the more the height and/or RF voltage may be increased. The rate of increase in the erosion compensation setpoint may initially be near 0 and increase over time. During a later portion of a life span of an edge ring the rate of increase may be exponential.

The etch rate uniformity may refer to a tilt angle of an etched surface relative to a reference plane or horizontal plane.

FIG. 11 is an example plot of etch rate uniformity versus time 1100 illustrating adjustments of erosion compensation setpoints for each substrate. Differences between the plot 1100 and the stepped plot 1000 illustrate improvements in accuracy for erosion compensation setpoints between (i) periodic performance of a metrology process, and (ii) substrate specific adjustment of one or more erosion compensation setpoints. The differences are shown by the hatched areas 1102 between the plots 1000 and 1100. With the EP signature, sample data information for each substrate is provided and monitored. This allows a new predicted erosion compensation value to be generated for each substrate providing a high sampling rate. There is no longer a need to wait for a metrology test to be performed.

Figure 12A:
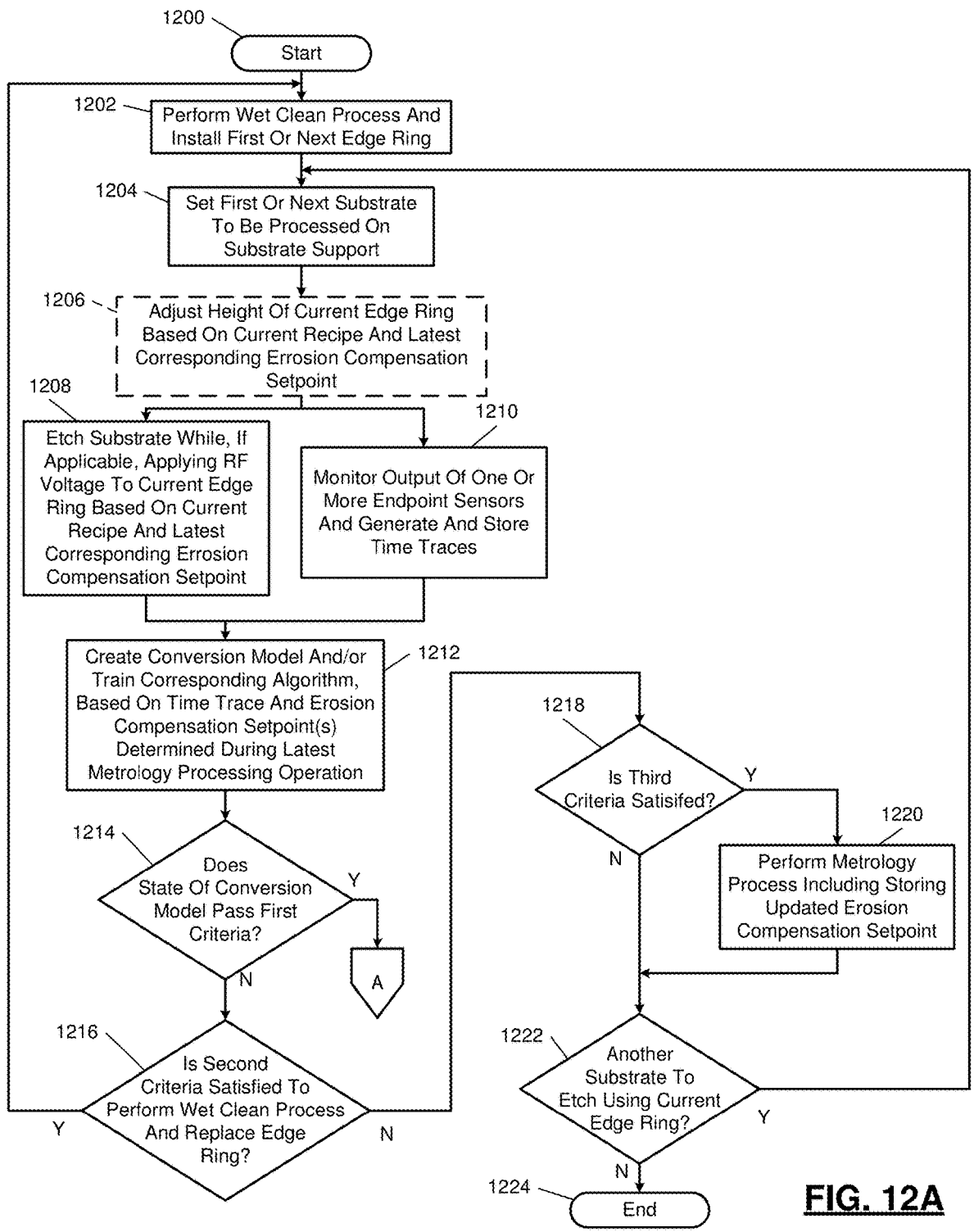
FIGS. 12A and 12B (collectively FIG. 12) is a flow diagram illustrating an erosion compensation method in accordance with an embodiment of the present disclosure.
Figure 12B:
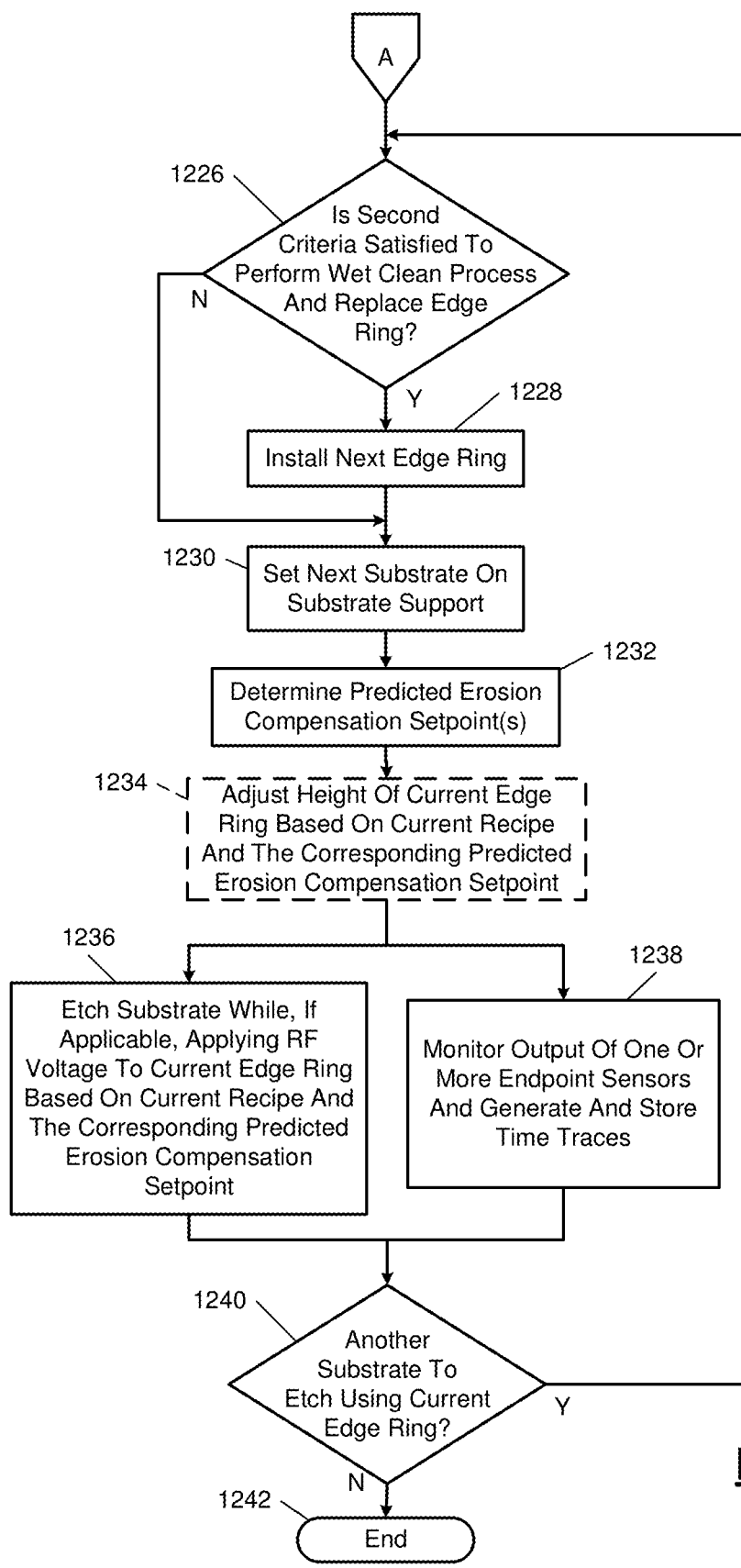

The systems disclosed herein may be operated using numerous methods, an example method is illustrated in FIG. 12. In FIG. 12, an erosion compensation method is shown. Although the following operations are primarily described with respect to the implementations of FIGS. 1, 2A, 2B and 5, the operations may be easily modified to apply to other implementations of the present disclosure. The operations may be iteratively performed.

The method may begin at 1200. At 1202, a wet clean process may be performed and a first edge ring or a next edge ring is installed on a substrate support in a processing chamber. If performing a first iteration of this operation, then a first edge ring is installed. At 1204, a first or next substrate to be processed is set on the substrate support 106. If performing a first iteration of this operation, then a first substrate is installed.

At 1206, depending on whether height of an edge ring is adjustable for the current substrate support, the height of the edge ring may be either set to a predetermined height or a height corresponding to an erosion compensation setpoint. The height may be set based on a current recipe. If performing a first iteration of this operation, the edge ring may be set to the predetermined height (or an initial height). Although not shown, a metrology process may be performed to determine the first (or initial) height. If this is a second or subsequent iteration, then the height may be adjusted based on results of a metrology process as performed at operation 1220.

At 1208, the current substrate is etched. While being etched a RF voltage may be applied to the current edge ring. If performing a first iteration of this operation, the RF voltage may be a predetermined (or initial) voltage. The RF voltage may be set based on a current recipe. Although not shown, a metrology process may be performed to determine the first RF voltage to apply. If this is a second or subsequent iteration, then the RF voltage may be adjusted based on results of a metrology process as performed at operation 1220. Operation 1210 may be performed while operation 1208 is performed. At 1210, at least one of the system controller 160 and the setpoint module 186 monitors outputs of one or more endpoint sensors, such as the outputs of the OES 188 and the IR absorption sensing assembly 190, and generates and stores corresponding time traces.

At 1212, the model generation module 502 generates a conversion model and/or trains a corresponding algorithm based on the time traces generated at 1210 and target setpoints. If performing a first iteration of this operation, then an initial conversion model is generated. The time period during which iterations of operation 1212 are performed is referred to as a learning period. The initial conversion model is than modified/updated in subsequent iterations of this operation. The initial conversion model and/or the updated versions of the conversion model may be provided based on a latest erosion compensation setpoint determined during a latest metrology processing operation.

In one embodiment, data associated with etching multiple substrates in multiple processing chambers is collected and combined to create and/or update the conversion model. For example, the time traces associated with endpoint sensors of the multiple processing chambers is provided to the model generation module 502, which then creates and/or updates the conversion model based on the time traces and the corresponding target setpoints from metrology processes performed. Each processing chamber may have a respective edge ring. The edge rings of the processing chambers may be essentially the same, in other words, have the same dimensions (within manufacturing tolerances) and formed of the same material compositions (within manufacturing tolerances). For example, the edge rings may have a same part number. This allows a single conversion model to be used for multiple processing chambers. A same conversion model may be used for multiple edge rings.

At 1214, the setpoint module 186 determines whether a state of the conversion model passes first criteria. For example, if the predicted erosion compensation setpoints provided by the conversion model based on a set of time traces are within a predetermined range of a 1:1 ratio with target setpoints (or 0% error) for the same time traces as provided from metrology, then the conversion model passes the first criteria. This may include creating a plot similar to that shown in FIG. 8. The predetermined range may, for example, correspond to providing less than 1-5% error. This may occur when 95% or more of the predicted erosion compensation setpoints are within a predetermined range of the target setpoints. If the first criteria have been satisfied, then a transition from passive operations to active operations occurs and operation 1226 may be performed, otherwise operation 1216 may be performed. Calibration of an EP signature occurs during the passive operations. Passive operations refer to making adjustments periodically (e.g., every predetermined number of substrates etched using a current edge ring and/or every predetermined number of RF operation hours of an edge ring) to erosion compensation setpoints based on results of performing metrology processes. Active operations refer to making adjustments to one or more erosion compensation setpoints for each substrate being etched without performing a metrology process.

In one embodiment, a single conversion model is created for an operational life span of an edge ring. In another embodiment, two or more conversion models are created for an operational life span of an edge ring. When multiple conversion models are created, each conversion model may be used for a certain period of the operational life span. For example, when two conversion models are created, the first conversion model may be used for a first portion of the operational life span and the second conversion model may be used for a second portion of the operational life span.

In one embodiment, the setpoint module 186 in determining whether a state of the conversion model passes first criteria determines an updated uniformity value and/or tilt angle. The updated uniformity value and/or tilt angle may be provided as or based on the output of the created conversion model.

At 1216, the system controller 160 may determine whether second criteria have been satisfied to perform a wet clean process and replace the current edge ring. For example, if a first predetermined number of substrates have been etched using the current edge ring and/or the current edge ring has experienced a first predetermined number of RF operation hours, then the second criteria has been satisfied and operation 1202 may be performed, otherwise operation 1218 may be performed.

At 1218, the setpoint module 186 determines whether third criteria have been satisfied to perform a metrology process. For example, if a second predetermined number of substrates have been etched using the current edge ring and/or the current edge ring has experienced a second predetermined number of RF operation hours, then the third criteria has been satisfied and operation 1220 may be performed, otherwise operation 1222 may be performed.

At 1220, a metrology process may be performed to determine one or more updated erosion compensation setpoints. This may include determining an updated height of the current edge ring and/or RF voltage to apply to the current edge ring. The updated erosion compensation setpoints are stored in memory and may be used during operations 1208 and 1212. At 1222, at least one of the system controller 160 and the setpoint module 186 determines whether another substrate is to be etched using the current edge ring. If another substrate is to be etched, operation 1204 is performed, otherwise the method may end at 1224.

At 1226, the system controller 160 may determine whether the second criteria have been satisfied to perform a wet clean process and replace the current edge ring. For example, if the first predetermined number of substrates have been etched using the current edge ring and/or the current edge ring has experienced the first predetermined number of RF operation hours, then the second criteria has been satisfied and operation 1228 may be performed, otherwise operation 1230 may be performed.

The conversion model(s) may be created prior to or subsequent to the wet clean processes performed at operations 1202 and 1226. In one embodiment, the setpoint module 186 does not proceed to operation 1230 until the second criteria are satisfied. In this example, after a first edge ring is replaced, then operations 1226, 1228, 1230, 1232, 1234, 1236, 1238 and 1240 are iteratively performed without performing a metrology process. In another embodiment, operations 1226, 1228, 1230, 1232, 1234, 1236, 1238 and 1240 are iteratively performed when the state of the currently being created conversion model satisfies the first criteria. This may be independent of whether the second criteria are satisfied.

At 1228, the current edge ring is replaced with a next edge ring. At 1230, a next substrate to be etched is set on the substrate support. At 1232, one or more predicted erosion compensation setpoints are determined using one of the one or more conversion models created during operations 1202, 1204, 1206, 1208, 1210, 1212, and 1214. The setpoint module 186 converts one or more of the latest time traces from the one or more endpoint sensors using the conversion model(s) to provide the predicted erosion compensation setpoint(s). The predicted erosion compensation setpoint(s) may be, for example, a height of the edge ring, an RF voltage to apply to the edge ring, and/or values representative of the height and/or the RF voltage. Operation 1232 may be performed prior to and/or while performing one or more of operations 1226, 1228 and 1230.

At 1234, a height of the current edge ring may be adjusted based on the corresponding predicted erosion compensation setpoint for the current substrate. The height may be adjusted based on a current recipe. At 1236, the current substrate is etched. While being etched a RF voltage may be applied to the current edge ring. The RF voltage may be adjusted based on the current recipe and the corresponding predicted erosion compensation setpoint for the current substrate. Operation 1238 may be performed while operation 1236 is performed. At 1238, at least one of the system controller 160 and the setpoint module 186 monitors outputs of the one or more endpoint sensors, such as the outputs of the OES 188 and the IR absorption sensing assembly 190, and generates and stores corresponding time traces.

At 1240, at least one of the system controller 160 and the setpoint module 186 determines whether another substrate is to be etched using the current edge ring. If another substrate is to be etched, operation 1226 is performed, otherwise the method may end at 1242.

Operations 1204, 1206, 1208, 1210, 1234, 1236, 1238 and/or one or more of the above-described operations provide feedback loops for adjusting erosion compensation values. A higher sampling rate is associated with active operations than the passive operations, since adjustments are made for each substrate rather than after processing of a predetermined number of substrates and/or experiencing a predetermined number of RF operational hours.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The above-described examples provide erosion compensation setpoint adjustment specific to each substrate. The adjustments are performed within performing a metrology process and thus are quickly performed. As a result, the described examples are well suited for high volume production. Production does not need to be slowed down and/or interrupted and include intermittent dead time due to metrology process measurements.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A substrate processing system comprising:
a model generation module configured to receive a first time trace based on an output of an endpoint sensor and obtain a target setpoint, wherein a portion of the first time trace is indicative of an endpoint at which a feature has been created in a first layer of a first substrate, wherein the target setpoint is generated based on a metrology process and is used to compensate for erosion of a first edge ring of a substrate support, and wherein the model generation module is configured to generate a conversion model based on the portion of the first time trace and the target setpoint; and
a setpoint module configured to
receive a second time trace based on the output of the endpoint sensor, wherein the second time trace is generated subsequent to generation of the first time trace, and
based on the conversion model, convert the second time trace to a predicted erosion compensation setpoint, wherein the predicted erosion compensation setpoint is set while processing a second substrate using the first edge ring or a second edge ring.

2. The substrate processing system of claim 1, wherein the endpoint refers to when etching the feature in the first substrate has removed material from the first layer to a point that the feature has reached a second layer of the first substrate.

3. The substrate processing system of claim 1, wherein the endpoint refers to when etching the feature in the first layer has completed and over-etching into a second layer of the first substrate is about to begin if etching continues.

4. The substrate processing system of claim 1, further comprising the endpoint sensor.

5. The substrate processing system of claim 4, wherein the endpoint sensor includes at least one of an optical emission spectrometer or an infrared absorption sensor.

6. The substrate processing system of claim 4, wherein the endpoint sensor includes an optical emission spectrometer and an infrared absorption sensor.

7. The substrate processing system of claim 1, wherein the setpoint module is configured to perform the metrology process to generate the target setpoint.

8. The substrate processing system of claim 1, wherein the target setpoint is:
a height of the first edge ring relative to the substrate support or the first substrate; or
a radio frequency voltage applied to the first edge ring.

9. The substrate processing system of claim 1, wherein the predicted erosion compensation setpoint is selected from a group consisting of a height of the first edge ring relative to the substrate support or the second substrate, a height of the second edge ring relative to the substrate support or the second substrate, a radio frequency voltage applied to the first edge ring, and a radio frequency applied to the second edge ring.

10. The substrate processing system of claim 1, wherein:
the predicted erosion compensation setpoint is an etch rate uniformity value or a tilt angle; and
the setpoint module is configured to, based on the etch rate uniformity value or the tilt angle, at least one of set a height of the first edge ring, set a height of the second edge ring, set a radio frequency voltage applied to the first edge ring, and set a radio frequency voltage applied to the second edge ring.

11. The substrate processing system of claim 1, wherein the predicted erosion compensation setpoint is not generated based on a metrology process performed subsequent to generation of the conversion model.

12. The substrate processing system of claim 1, wherein the setpoint module does not perform a metrology process subsequent to the generation of the conversion model.

13. The substrate processing system of claim 1, wherein the predicted erosion compensation setpoint is updated for each substrate processed subsequent to the generation of the conversion model.

14. A method of operating a substrate processing system, the method comprising:
receiving a first time trace based on an output of an endpoint sensor, wherein a portion of the first time trace is indicative of an endpoint at which a feature has been created in a first layer of a first substrate;
obtaining a target setpoint, wherein the target setpoint is generated based on a metrology process and is used to compensate for erosion of a first edge ring of a substrate support;
generating a conversion model based on the portion of the first time trace and the target setpoint;
receiving a second time trace based on the output of the endpoint sensor, wherein the second time trace is generated subsequent to generation of the first time trace; and
based on the conversion model, converting the second time trace to a predicted erosion compensation setpoint, wherein the predicted erosion compensation setpoint is set while processing a second substrate using the first edge ring or a second edge ring.

15. The method of claim 14, wherein the endpoint refers to when etching the feature in the first substrate has removed material from the first layer to a point that the feature has reached a second layer of the first substrate.

16. The method of claim 14, wherein the endpoint refers to when etching the feature in the first layer has completed and over-etching into a second layer of the first substrate is about to begin should etching continue.

17. The method of claim 14, wherein the endpoint sensor includes at least one of an optical emission spectrometer or an infrared absorption sensor.

18. The method of claim 14, wherein the endpoint sensor includes an optical emission spectrometer and an infrared absorption sensor.

19. The method of claim 14, further comprising performing the metrology process to generate the target setpoint.

20. The method of claim 14, wherein:
the target setpoint is
a first height of the first edge ring relative to the substrate support or the first substrate, or
a first radio frequency voltage applied to the first edge ring; and
the predicted erosion compensation setpoint is selected from a group consisting of a second height of the first edge ring relative to the substrate support or the second substrate, a height of the second edge ring relative to the substrate support or the second substrate, a second radio frequency voltage applied to the first edge ring, and a radio frequency voltage applied to the second edge ring.

21. The method of claim 14, further comprising, based on an etch rate uniformity value or a tilt angle, setting a height of the first edge ring, setting a height of the second edge ring, setting a radio frequency voltage applied to the first edge ring, or setting a radio frequency voltage applied to the second edge ring,
   wherein the predicted erosion compensation setpoint is the etch rate uniformity value or the tilt angle.

22. The method of claim 14, wherein the predicted erosion compensation setpoint is not generated based on a metrology process performed subsequent to generation of the conversion model.

23. The method of claim 14, wherein no metrology process is performed subsequent to the generation of the conversion model.

24. The method of claim 14; wherein:
   the predicted erosion compensation setpoint is updated for each substrate processed subsequent to the generation of the conversion model; and
   no metrology process is performed subsequent to the generation of the conversion model.

* * * * *